(12) United States Patent
Kasuya et al.

(10) Patent No.: US 8,829,660 B2
(45) Date of Patent: Sep. 9, 2014

(54) RESIN-ENCAPSULATED SEMICONDUCTOR DEVICE

(75) Inventors: Yasumasa Kasuya, Kyoto (JP); Motoharu Haga, Kyoto (JP); Shoji Yasunaga, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 13/233,825

(22) Filed: Sep. 15, 2011

(65) Prior Publication Data

US 2012/0007247 A1    Jan. 12, 2012

Related U.S. Application Data

(62) Division of application No. 12/524,646, filed as application No. PCT/JP2008/050952 on Jan. 24, 2008, now Pat. No. 8,039,934.

(30) Foreign Application Priority Data

Jan. 30, 2007  (JP) .................................. 2007-019219

(51) Int. Cl.
*H01L 23/495*  (2006.01)

(52) U.S. Cl.
USPC ................. 257/672; 257/676; 257/E23.037; 257/E23.002

(58) Field of Classification Search
CPC ............ H01L 23/564; H01L 23/49503; H01L 23/4951; H01L 23/49541; H01L 23/49513; H01L 23/49537; H01L 23/495
USPC ........... 257/672, 676, 677, E23.037, E23.002
See application file for complete search history.

(56) References Cited

U.S. PATENT DOCUMENTS

| | | | | |
|---|---|---|---|---|
| 6,501,156 B1* | 12/2002 | Nakanishi et al. | ............ | 257/666 |
| 7,211,471 B1* | 5/2007 | Foster | ............ | 438/123 |
| 7,262,491 B2* | 8/2007 | Islam et al. | ............ | 257/670 |
| 7,327,044 B2* | 2/2008 | Northcutt | ............ | 257/787 |
| 2002/0056924 A1* | 5/2002 | Chung et al. | ............ | 257/784 |
| 2002/0096790 A1* | 7/2002 | Kasuya | ............ | 257/787 |
| 2004/0089928 A1* | 5/2004 | Nakajima et al. | ............ | 257/678 |
| 2005/0121756 A1* | 6/2005 | Chow et al. | ............ | 257/676 |
| 2008/0079127 A1* | 4/2008 | Gerber | ............ | 257/676 |

FOREIGN PATENT DOCUMENTS

| | | |
|---|---|---|
| JP | 62-136059 | 6/1987 |
| JP | 07-058273 | 3/1995 |
| JP | 08-162590 | 6/1996 |
| JP | 10-335540 | 12/1998 |
| JP | 11-260990 | 9/1999 |
| JP | 2006-302963 | 11/2006 |
| TW | 200639995 | 11/2006 |

OTHER PUBLICATIONS

Official communication in Taiwanese patent application 097103545 (dated Sep. 7, 2011).

* cited by examiner

*Primary Examiner* — Tan N Tran
(74) *Attorney, Agent, or Firm* — Fish & Richardson P.C.

(57) ABSTRACT

A resin-sealed semiconductor device includes a semiconductor chip including a silicon substrate; a die pad on which the semiconductor chip is secured via a solder layer; a sealing resin layer sealing the semiconductor chip; and lead terminals connected electrically with the semiconductor chip. One end portion of the lead terminals is covered by the sealing resin layer. The die pad and the lead terminals are formed of copper and a copper alloy, and the die pad is formed with a thickness larger than a thickness of the lead terminals, which is a thickness of 0.25 mm or more.

14 Claims, 10 Drawing Sheets

RESIN-ENCAPSULATED SEMICONDUCTOR DEVICE

This application is a divisional application of U.S. patent application Ser. No. 12/524,646, filed on Jul. 27, 2009, which is a national phase of PCT/JP2008/050952, filed on Jan. 24, 2008, which in turn claims the benefit of priority of Japanese Patent Application No. 2007-019219, filed on Jan. 30, 2007. The disclosures of the foregoing applications are incorporated by reference herein.

TECHNICAL FIELD

The present invention relates to a resin-sealed semiconductor device and a method of manufacturing it. More particularly, the present invention relates to a resin-sealed semiconductor device that includes a die pad to which a semiconductor chip is secured and a method of manufacturing it.

BACKGROUND ART

Conventionally, there are known resin-sealed semiconductor devices that include a die pad to which a semiconductor chip is secured (e.g., see Patent Document 1).

In Patent Document 1 just mentioned, a resin-sealed semiconductor device is described that includes a die pad on which a semiconductor chip is secured, a package (sealing resin layer) that seals the semiconductor chip, and lead terminals electrically connected with the semiconductor chip. In such conventional resin-sealed semiconductor devices, typically, a semiconductor chip is secured on a die pad via a solder layer.

Patent Document 1: JP-A-2006-302963 Publication

DISCLOSURE OF THE INVENTION

Problems to be Solved by the Invention

In the conventional resin-sealed semiconductor devices described above, however, has the following disadvantages. Because the semiconductor chip is secured on the die pad via the solder layer, there arises an inconvenience in which, due to the difference in thermal expansion coefficient between the semiconductor chip and the die pad, great stress acts on the semiconductor chip. Thus, with great stress acting on the semiconductor chip, the semiconductor chip may suffer damage such as in the form of cracks.

The present invention is devised to solve the above problems. An object of the present invention is to provide a resin-sealed semiconductor device that can prevent damage to a semiconductor chip.

Another object of the present invention is to provide a method of manufacturing a resin-sealed semiconductor device that can prevent damage to a semiconductor chip.

Means for Solving the Problem

To achieve the above objects, according to a first aspect of the present invention, a resin-sealed semiconductor device is provided with a semiconductor chip including a silicon substrate, a die pad on which the semiconductor chip is secured via a solder layer, a sealing resin layer sealing the semiconductor chip, and a plurality of lead terminals connected electrically with the semiconductor chip, one end portions of the plurality of lead terminals being covered with the sealing resin layer. The lead terminals are formed of copper or a copper alloy. The die pad is formed of a 42 alloy or a Kovar alloy. In addition, the die pad is formed with a thickness equal to or less than that of the lead terminals. Note that a "42 alloy" according to the invention is an alloy of iron containing about 42% nickel. A "Kovar alloy" according to the invention is an alloy in which nickel and cobalt are added to iron.

In the resin-sealed semiconductor device according to the first aspect, the die pad is formed of a 42 alloy or a Kovar alloy as described above. This, compared with where the die pad is formed of a copper alloy or the like, helps make the difference in thermal expansion coefficient between the die pad and the semiconductor chip small. Thus, even though the semiconductor chip is secured on the die pad via the solder layer, it is possible to make the difference in warping between the die pad and the semiconductor chip small. Specifically, the thermal expansion coefficients of a 42 alloy and a Kovar alloy are about 4 to 8 ppm/K and about 5 to 7 ppm/K, respectively, and are both, compared with the thermal expansion coefficient (about 17 ppm/K) of a copper alloy, close to the thermal expansion coefficient (about 3 to 4 ppm/K) of the semiconductor chip (silicon substrate). Thus, it is possible to make the difference in the amount of thermal expansion, at the time of soldering, between the semiconductor chip and the die pad small. It is therefore possible, at the time of securing the semiconductor chip on the die pad via the solder layer, to make the difference in warping, resulting from temperature drop, between the die pad and the semiconductor chip small, and it is thus possible to alleviate stress acting on the semiconductor chip. This makes it possible to prevent the semiconductor chip from suffering damage such as in the form of cracks. Moreover, the die pad is formed with a thickness equal to or less than the thickness of the lead terminals. In this way, even though the die pad is formed of a 42 alloy or a Kovar alloy, it is possible to easily form the die pad and thus to easily obtain the resin-sealed semiconductor device in which the difference in thermal expansion coefficient between the semiconductor chip and the die pad is small. Moreover by forming the die pad with a thickness equal to or less than the thickness of the lead terminals, it is possible to make the resin-sealed semiconductor device slim.

Moreover, in the first aspect, the lead terminals are formed of copper or a copper alloy, which are materials different from a 42 alloy or a Kovar alloy, of which the die pad is formed. In this way, as distinct from where the lead terminals are formed of a 42 alloy or a Kovar alloy, of which the die pad is formed, it is possible to make the thermal expansion coefficient (about 17 ppm/K) of the lead terminals substantially equal to the thermal expansion coefficient (e.g., about 17 ppm/K) of the mounting substrate formed of glass epoxy or the like. Thus, at the time of surface-mounting the resin-sealed semiconductor device on the mounting substrate, even if the resin-sealed semiconductor device, the mounting substrate, etc. are subjected to a temperature change cycle, it is possible to alleviate thermal stress acting on a solder junction that electrically connects the lead terminals with the mounting substrate. In this way, even though the die pad is formed of a 42 alloy or a Kovar alloy, it is possible to prevent a crack from developing in the solder junction. Thus, it is possible to prevent an inconvenience in which, due to a crack developing in the solder junction, the electrical connection between the lead terminals and the mounting substrate is cut. As a result, it is possible, while preventing damage to the semiconductor chip, to prevent lowering in the mounting reliability of the resin-sealed semiconductor device.

According to a second aspect of the invention, a resin-sealed semiconductor device is provided with a semiconductor chip including a silicon substrate, a die pad on which the semiconductor chip is secured via a solder layer, a sealing resin layer sealing the semiconductor chip, and a plurality of lead terminals connected electrically with the semiconductor chip, one end portions of the plurality of lead terminals being covered with the sealing resin layer. The die pad and the lead terminals are formed of copper or a copper alloy. In addition, the die pad is formed with a thickness larger than that of the lead terminals, specifically 0.25 mm or more.

In the resin-sealed semiconductor device according to the second aspect, as described above, the die pad is formed with a thickness larger than the lead terminals, specifically 0.25 mm or more. This makes it possible to provide the die pad with adequate strength. Thus, even though the die pad is formed of copper or a copper alloy, it is possible, at the time of securing the semiconductor chip, via the solder layer, on the die pad, to prevent an increase in the warping in the die pad. Thus, it is possible to alleviate stress acting on the semiconductor chip and thus to prevent the semiconductor chip from suffering damage such as in the form of cracks. Moreover, the die pad and the lead terminals are given different thicknesses. In this way, even though the thickness of the die pad is made large, it is possible to prevent an increase in the thickness of the lead terminals and thus to easily form, bend, etc. the lead terminals. Thus, it is possible, while preventing damage to the semiconductor chip, to enhance the manufacturing efficiency of the resin-sealed semiconductor device.

Moreover, in the second aspect, the lead terminals are formed of copper or a copper alloy. This helps make the thermal expansion coefficient (about 17 ppm/K) of the lead terminals substantially equal to the thermal expansion coefficient (e.g., about 17 ppm/K) of the mounting substrate formed of glass epoxy or the like. Thus, at the time of surface-mounting the resin-sealed semiconductor device on the mounting substrate, even if the resin-sealed semiconductor device, the mounting substrate, etc. are subjected to a temperature change cycle, it is possible to alleviate thermal stress acting on a solder junction that electrically connects the lead terminals with the mounting substrate. This makes it possible to prevent a crack from developing in the solder junction. Thus, it is possible to prevent an inconvenience in which, due to a crack developing in the solder junction, the electrical connection between the lead terminals and the mounting substrate is cut. As a result, it is possible, while preventing damage to the semiconductor chip, to prevent lowering in the mounting reliability of the resin-sealed semiconductor device.

In this case, preferably, the die pad is formed with a thickness larger than the lead terminals, specifically 0.5 mm or more. With this structure, it is possible to provide the die pad with further adequate strength. Thus, even though the die pad is formed of copper or a copper alloy, it is possible, at the time of securing the semiconductor chip, via the solder layer, on the die pad, to prevent an increase in the warping in the die pad. Thus, it is possible to easily alleviate stress acting on the semiconductor chip and thus to easily prevent the semiconductor chip from suffering damage such as in the form of cracks.

In the resin-sealed semiconductor device according to the above-described first and second aspects, preferably, the semiconductor chip is secured on one main surface of the die pad, and the die pad is disposed such that the other main surface of the die pad opposite from the one main surface thereof is exposed through the sealing resin layer. With this structure, it is possible to make the other main surface of the die pad, which is exposed through the sealing resin layer, in thermal contact with the mounting surface of the mounting substrate. This makes it possible to transfer the heat generated during operation of the semiconductor chip, via the die pad, to the mounting substrate. Thus, it is possible, while preventing damage to the semiconductor chip, to enhance the heat dissipation properties.

In the resin-sealed semiconductor device according to the above-described first and second aspects, preferably, in the die pad, in a corner part formed by the other main surface and a side surface, a cut-off portion is provided. With this structure, even if moisture etc. enters through the interface between the die pad and the sealing resin layer, it is possible to lengthen the entry path to the semiconductor chip. This makes the moisture etc. less likely to reach the semiconductor chip. It is therefore possible to prevent an inconvenience in which, due to the moisture etc. that has reached the semiconductor chip thermally expanding, the semiconductor chip is damaged. In addition, it is possible to prevent a lowering in the reliability due to the moisture etc. entering and reaching the semiconductor chip.

In this case, preferably, the die pad is quadrangular as seen in a plan view, the cut-off portion is provided one in each of four corners formed by the other main surface of the die pad and side surfaces of the die pad. With this structure, even if moisture etc. enters through the interface between the die pad and the sealing resin layer, it is possible to easily make the moisture etc. less likely to reach the semiconductor chip. It is therefore possible to prevent an inconvenience easily in which, due to the moisture etc. that has reached the semiconductor chip thermally expanding, the semiconductor chip is damaged. In addition, it is possible to prevent a lowering in the reliability due to the moisture etc. entering and reaching the semiconductor chip.

In the resin-sealed semiconductor device according to the above-described first and second aspects, preferably, the die pad has a plan area larger than the semiconductor chip; in the die pad, in a predetermined region other than a region to which the semiconductor chip is secured, an open part that penetrates from one main surface side to the other main surface side of the die pad is provided. With this structure, even if the moisture etc. that has entered through the interface between the die pad and the sealing resin layer reaches the one main surface side of the die pad to which the semiconductor chip is secured, it is possible to remove the moisture etc., via the open part, to the other surface side of the die pad. Thus, it is possible to prevent the accumulation of moisture etc. near the semiconductor chip. It is therefore possible to prevent an inconvenience more easily in which, due to the moisture etc. that has reached the semiconductor chip thermally expanding, the semiconductor chip is damaged.

In this case, preferably, as the open part, a plurality of open parts are so provided as to surround the semiconductor chip as seen in a plan view. With this structure, it possible to easily remove the moisture etc. that has reached the one main surface side of the die pad, via the plurality of open parts, to the other main surface side of the die pad. Thus, it is possible to easily prevent the accumulation of moisture etc. near the semiconductor chip. It is therefore possible to prevent an inconvenience more easily in which, due to the moisture etc. that has reached the semiconductor chip thermally expanding, the semiconductor chip is damaged.

According to a third aspect of the invention, a method of manufacturing a resin-sealed semiconductor device is provided with a step of forming a lead frame including a lead terminal, a step of forming a die pad as a separate piece from the lead frame, a step of securing a semiconductor chip including a silicon substrate, via a solder layer, on one main surface of the die pad, and a step of resin-sealing at least the semiconductor chip with a sealing resin layer. The step of forming the lead frame includes a step of forming the lead frame with copper or a copper alloy. The step of forming the die pad includes a step of forming the die pad with a 42 alloy or a Kovar alloy and a step of forming the die pad with a thickness equal to or less than a thickness of the lead frame. Note that a "42 alloy" according to the present invention is an alloy of iron containing about 42% nickel. A "Kovar" alloy according to the invention is an alloy in which nickel and cobalt are added to iron.

According to the third aspect, in the method of manufacturing a resin-sealed semiconductor device, the die pad is formed of a 42 alloy or a Kovar alloy as described above. This, compared with where the die pad is formed of a copper alloy or the like, helps make the difference in thermal expansion coefficient between the die pad and the semiconductor chip small. Thus, even though the semiconductor chip is secured on the die pad via the solder layer, it is possible to make the difference in warping between the die pad and the semiconductor chip small. Specifically, the thermal expansion coefficients of a 42 alloy and a Kovar alloy are about 4 to 8 ppm/K and about 5 to 7 ppm/K, respectively, and are both, compared with the thermal expansion coefficient (about 17 ppm/K) of a copper alloy, close to the thermal expansion coefficient (about 3 to 4 ppm/K) of the semiconductor chip (silicon substrate). Thus, it is possible to make the difference in the amount of thermal expansion, at the time of soldering, between the semiconductor chip and the die pad small. It is therefore possible, at the time of securing the semiconductor chip on the die pad via the solder layer, to make the difference in warping, resulting from temperature drop, between the die pad and the semiconductor chip small, and it is thus possible to alleviate stress acting on the semiconductor chip. This makes it possible to prevent the semiconductor chip from suffering damage such as in the form of cracks. Moreover, the die pad is formed with a thickness equal to or less than the thickness of the lead frame. In this way, even though the die pad is formed of a 42 alloy or a Kovar alloy, it is possible to easily form the die pad and thus to easily manufacture the resin-sealed semiconductor device in which the difference in thermal expansion coefficient between the semiconductor chip and the die pad is small. Moreover by forming the die pad with a thickness equal to or less than the thickness of the lead frame, it is possible to make the resin-sealed semiconductor device slim.

Moreover, in the third aspect, the lead frame is formed of copper or a copper alloy. This, as distinct from where the lead frame is formed integrally with the die pad using a 42 alloy or a Kovar alloy, helps make the thermal expansion coefficient (about 17 ppm/K) of the lead frame substantially equal to the thermal expansion coefficient (e.g., about 17 ppm/K) of the mounting substrate formed of glass epoxy or the like. Thus, at the time of surface-mounting the manufactured resin-sealed semiconductor device on the mounting substrate, even if the resin-sealed semiconductor device, the mounting substrate, etc. are subjected to a temperature change cycle, it is possible to alleviate thermal stress acting on a solder junction that electrically connects the lead terminals with the mounting substrate. In this way, even though the die pad is formed of a 42 alloy or a Kovar alloy, it is possible to prevent a crack from developing in the solder junction. Thus, it is possible to prevent an inconvenience in which, due to a crack developing in the solder junction, the electrical connection between the lead terminals and the mounting substrate is cut. As a result, it is possible, while preventing damage to the semiconductor chip, to prevent lowering in the mounting reliability of the resin-sealed semiconductor device.

According to a fourth aspect of the invention, a method of manufacturing a resin-sealed semiconductor device is provided with a step of forming a lead frame including a lead terminal, a step of forming a die pad as a separate piece from the lead frame, a step of securing a semiconductor chip including a silicon substrate, via a solder layer, on one main surface of the die pad, and a step of resin-sealing at least the semiconductor chip with a sealing resin layer. The step of forming the lead frame includes a step of forming the lead frame with copper or a copper alloy. The step of forming the die pad includes a step of forming the die pad with copper or a copper alloy and a step of forming the die pad with a thickness larger than the lead frame, specifically 0.25 mm or more.

In the method of manufacturing the resin-sealed semiconductor device according to the fourth aspect, as described above, the die pad is formed with a thickness larger than the lead frame, specifically 0.25 mm or more. This makes it possible to provide the die pad with adequate strength. Thus, even though the die pad is formed of copper or a copper alloy, it is possible, at the time of securing the semiconductor chip, via the solder layer, on the die pad, to prevent an increase in the warping in the die pad. Thus, it is possible to alleviate stress acting on the semiconductor chip and thus to prevent the semiconductor chip from suffering damage such as in the form of cracks. Moreover, the die pad and the lead frame are given different thicknesses. In this way, even though the thickness of the die pad is made large, it is possible to prevent an increase in the thickness of the lead frame. This helps facilitate the formation of the lead frame, the bending of the lead terminals, etc. Thus, it is possible, while preventing damage to the semiconductor chip, to enhance the manufacturing efficiency of the resin-sealed semiconductor device.

Moreover, in the fourth aspect, the lead frame is formed of copper or a copper alloy. This helps make the thermal expansion coefficient (about 17 ppm/K) of the lead frame substantially equal to the thermal expansion coefficient (e.g., about 17 ppm/K) of the mounting substrate formed of glass epoxy or the like. Thus, at the time of surface-mounting the resin-sealed semiconductor device on the mounting substrate, even if the resin-sealed semiconductor device, the mounting substrate, etc. are subjected to a temperature change cycle, it is possible to alleviate thermal stress acting on a solder junction that electrically connects the lead terminals of the lead frame with the mounting substrate. This makes it possible to prevent a crack from developing in the solder junction. Thus, it is possible to prevent an inconvenience in which, due to a crack developing in the solder junction, the electrical connection between the lead terminals and the mounting substrate is cut. As a result, it is possible, while preventing damage to the semiconductor chip, to prevent lowering in the mounting reliability of the resin-sealed semiconductor device.

In this case, preferably, the step of forming the die pad includes a step of forming the die pad with a thickness larger than the lead frame, specifically 0.5 mm or more. In this way, it is possible to provide the die pad with further adequate strength. Thus, even though the die pad is formed of copper or a copper alloy, it is possible, at the time of securing the semiconductor chip, via the solder layer, on the die pad, to prevent an increase in the warping in the die pad. Thus, it is possible to easily alleviate stress acting on the semiconductor chip and thus to easily prevent the semiconductor chip from suffering damage such as in the form of cracks.

In the method of manufacturing the resin-sealed semiconductor device according to the above-described third and fourth aspects, preferably, after the step of securing the semiconductor chip on the die pad, a step is further provided in which, by ultrasonic joining, the die pad on which the semiconductor chip is secured is joined to a predetermined position on the lead frame. With this structure, even though the die pad is formed as a separate piece from the lead frame, it is possible to easily join the die pad to the predetermined position on the lead frame. Thus, it is possible to easily manufacture the resin-sealed semiconductor device that can prevent damage to the semiconductor chip. Moreover, by joining the die pad to the lead frame by ultrasonic joining, it is possible to prevent various inconveniences that occur when the die pad is joined to the lead frame by swage joining or spot welding, other than ultrasonic joining. Specifically, when the die pad is joined to the lead frame by swage joining, there are required pins, dies, etc. to perform swage joining. This inconveniently requires an increased number of components and extra manufacturing equipment. On the other hand, when the die pad is joined to the lead frame by spot welding, due to the heat generated during welding, the semiconductor chip secured on the die pad inconveniently suffers thermal damage. Thus, by joining the die pad to the lead frame by ultrasonic joining, it is possible to prevent an increase in the number of components and the need for extra manufacturing equipment, and in addition to prevent an inconvenience in which the semiconductor chip suffers thermal damage.

Advantages of the Invention

As described above, according to the present invention, it is possible to obtain a resin-sealed semiconductor device that can prevent damage to a semiconductor chip.

Moreover, according to the invention, it is possible to obtain a method of manufacturing a resin-sealed semiconductor device that can prevent damage to a semiconductor chip.

LIST OF REFERENCE SYMBOLS

Figure 1:
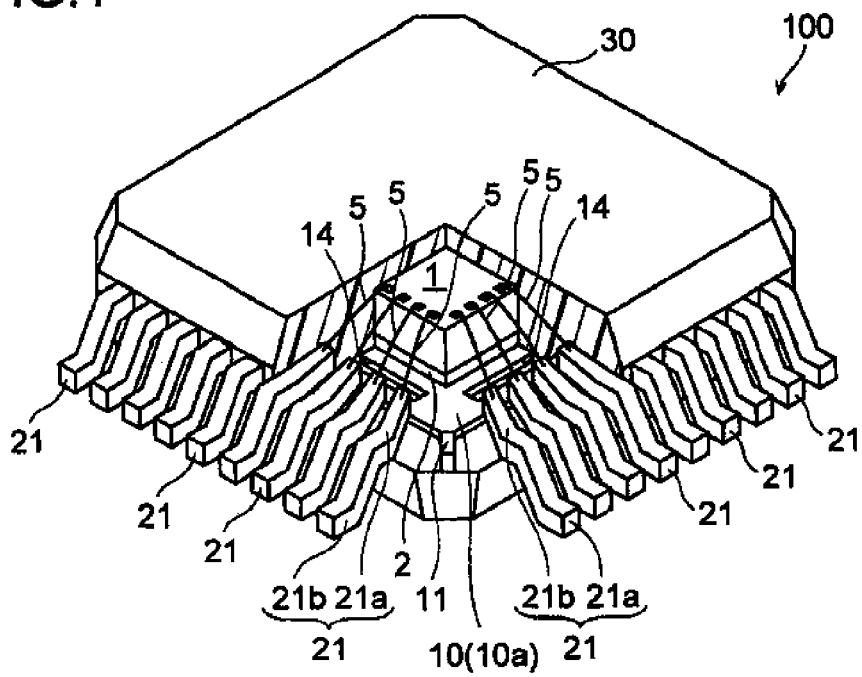
FIG. 1 An overall perspective view showing a resin-sealed semiconductor device, with part of a sealing resin layer removed, according to a first embodiment of the present invention.

1 Semiconductor chip
2 First solder layer (solder layer)
3 Second solder layer
4 Third solder layer
5 Bonding wire
10, 110 Die pad
10a, 110a Top surface (one main surface)
10b, 110b Bottom surface (the other main surface)
11, 111 Suspension lead
12, 112 Cut-off portion
13, 113 Chip securing region
14, 114 Open part
20 Lead frame
21 Lead terminal
21a Outer lead portion
21b Inner lead portion (one end portion)
22 Dam member
30 Sealing resin layer
40 Mounting substrate
100, 200 Resin-sealed semiconductor device

BEST MODE FOR CARRYING OUT THE INVENTION

A description will now be given of embodiments of the present invention with reference to the accompanying drawings. The embodiments presented below deal with cases where the present invention is applied to a resin-sealed semiconductor device of a QFP (quad flat package) type as an example of a resin-sealed semiconductor device.

First Embodiment

Figure 2:
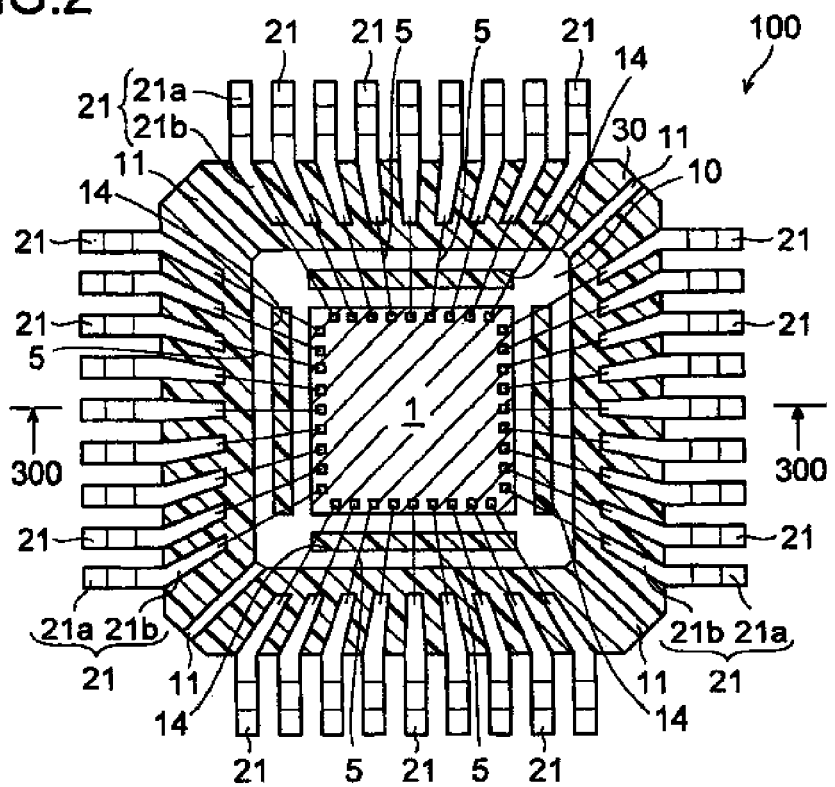
FIG. 2 A plan view showing the resin-sealed semiconductor device, with part of the sealing resin layer removed, according to the first embodiment of the invention shown in FIG. 1.
Figure 3:
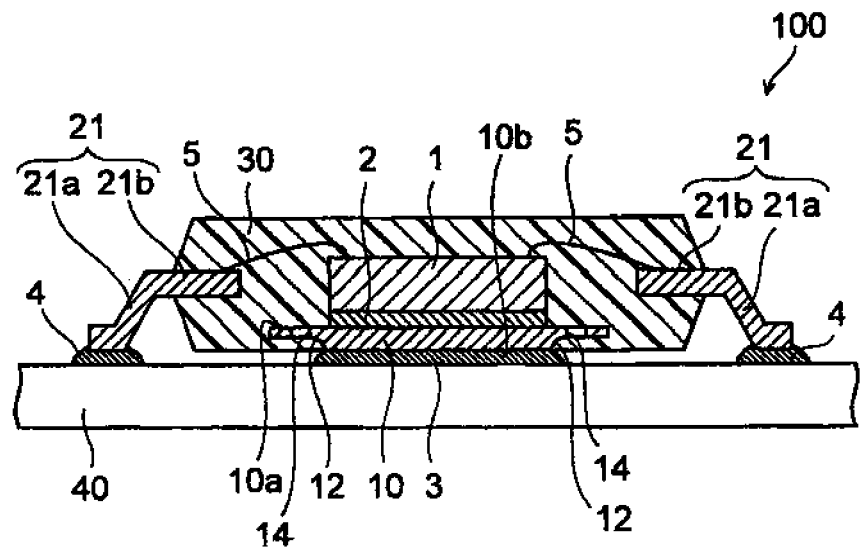
FIG. 3 A sectional view taken along line 300-300 in FIG. 2.
Figure 4:
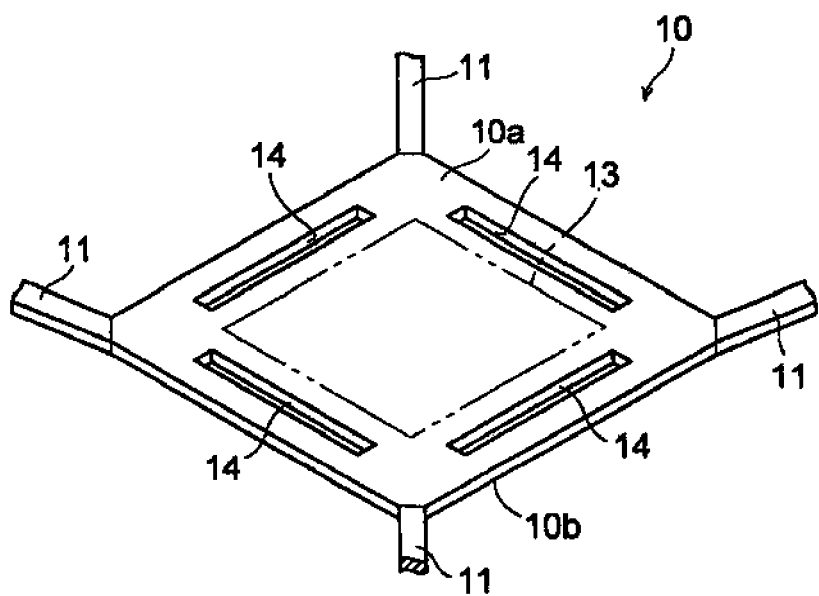
FIG. 4 An overall perspective view of a die pad of the resin-sealed semiconductor device according to the first embodiment of the invention shown in FIG. 1.
Figure 5:
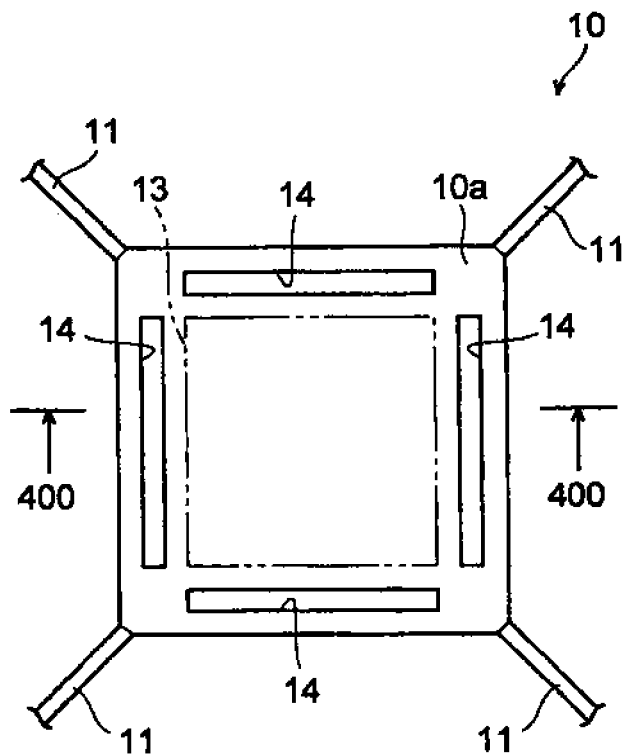
FIG. 5 A plan view of the die pad of the resin-sealed semiconductor device according to the first embodiment of the invention shown in FIG. 1.
Figure 6:
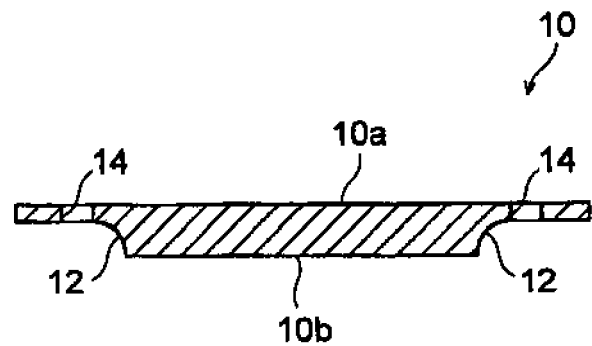
FIG. 6 A sectional view taken along line 400-400 in FIG. 5.

FIG. 1 is an overall perspective view showing a resin-sealed semiconductor device, with part of a sealing resin layer removed, according to a first embodiment of the present invention. FIG. 2 is a plan view showing the resin-sealed semiconductor device, with part of the sealing resin layer removed, according to the first embodiment of the invention shown in FIG. 1. FIG. 3 is a sectional view taken along line 300-300 in FIG. 2. FIGS. 4 to 6 are diagrams illustrating the structure of a die pad of the resin-sealed semiconductor device according to the first embodiment of the invention shown in FIG. 1. First, with reference to FIGS. 1 to 6, the structure of the resin-sealed semiconductor device 100 according to the first embodiment of the invention will be described.

The resin-sealed semiconductor device 100 according to the first embodiment is provided with, as shown in FIGS. 1 to 3, a semiconductor chip 1, a die pad 10 to which the semiconductor chip 1 is secured, a plurality of lead terminals 21, and a sealing resin layer 30.

The semiconductor chip 1 has a structure in which a semiconductor layer (unillustrated) is formed on a silicon substrate (unillustrated), and is formed with a thickness of about 300 μm. The semiconductor chip 1 is secured, via a first solder layer 2 (see FIGS. 1 and 3) formed of high-melting solder (Pb-5% Sn) or the like, on a top surface (one main surface) 10*a* of the die pad 10. That is, the semiconductor chip 1 is joined to the top surface 10*a* of the die pad 10 with solder. Note that the first solder layer 2 is one example of a "solder layer" according to the invention.

The die pad 10 is, as shown in FIGS. 2 and 5, formed to be substantially quadrangular as seen in a plan view. In addition, the die pad 10 includes four suspension leads 11 integrally joined thereto.

Here, in the first embodiment, the die pad 10 is formed of a 42 alloy (Fe-42Ni alloy) or a Kovar alloy. Moreover, the die pad 10 is formed with a thickness equal to or less than the thickness (about 0.15 mm) of the lead terminals 21 described later. Specifically, the die pad 10 is formed with a thickness of about 0.125 mm. Moreover, in corner parts formed by a bottom surface (the other main surface) 10*b* of the die pad 10 and side surfaces of the die pad 10, cut-off portions 12 are provided as shown in FIG. 6. The cut-off portions 12 are provided one in each of four corner parts formed by the bottom surface 10*b* of the die pad 10 and the side surfaces of the die pad 10.

Moreover, in the first embodiment, the die pad 10 is formed to have a plan area larger than the semiconductor chip 1 as shown in FIG. 2; in a predetermined region on the top surface 10*a* of the die pad 10, a chip securing region 13 for securing the semiconductor chip 1 is provided as shown in FIGS. 4 and 5. On the other hand, in a predetermined region other than the chip securing region 13 of the die pad 10, an open part 14 that penetrates from the top surface 10*a* side to the bottom surface 10*b* side of the die pad 10 is formed as shown in FIGS. 4 to 6. As the open part 14, a plurality of them are so provided as to surround the chip securing region 13 (semiconductor chip 1). In this way, even if moisture etc. accumulates near the semiconductor chip 1, the moisture etc. is removed, via the open parts 14, to the bottom surface 10*b* side of the die pad 10.

The four suspension leads 11 are disposed one at each of the four corner parts of the die pad 10, and are so formed as to extend radially as seen in a plan view. The four suspension leads 11 are provided for the purpose of holding the die pad 10 on a lead frame 20 described later. Moreover, the four suspension leads 11 are each bent such that the die pad 10 is "down set". Thus, as shown in FIG. 3, the die pad 10 according to the first embodiment is disposed at a level lower than an inner lead portion 21*b* described later. Moreover, the die pad 10 is disposed such that the bottom surface 10*b* thereof is exposed through the bottom surface of the sealing resin layer 30. Note that the exposed bottom surface 10*b* of the die pad 10 is in thermal contact with the mounting surface of a mounting substrate 40 via a second solder layer 3.

The plurality of lead terminals 21 are formed of a material based on copper (copper or a copper alloy) such as phosphor bronze or oxygen-free copper, and are formed with a thickness of about 0.15 mm. Moreover, as shown in FIGS. 1 to 3, the plurality of lead terminals 21 each have an outer lead portion 21*a*, which extends out from the sealing resin layer 30, and an inner lead portion (one end portion) 21*b* covered by the sealing resin layer 30 along with the semiconductor chip 1. As shown in FIG. 3, the outer lead portions 21*a* are bent such that the lead terminals 21 have a gull-wing shape, and are electrically connected to (surface mounted on) the mounting substrate 40 via a third solder layer 4. The mounting substrate 40 is formed of glass epoxy or the like. Furthermore, as shown in FIGS. 1 to 3, the inner lead portions 21*b* are electrically connected to the semiconductor chip 1 via bonding wires (e.g., gold leads) 5. That is, the semiconductor chip 1 is electrically connected to the mounting substrate 40.

Moreover, the plurality of lead terminals 21 are separated from one another. In addition, the plurality of lead terminals 21 are so disposed as to surround the die pad 10 from four directions. Specifically, as shown in FIG. 2, the plurality of lead terminals 21 divide into four groups each including a predetermined number of lead terminals 21. In addition, the four groups each including a predetermined number of the lead terminals 21 are so disposed as to surround the die pad 10 from four directions. Disposing the plurality of lead terminals 21 as described above allows the plurality of gull-wing-shaped lead terminals 21 to extend in four directions, a predetermined number of them in each direction.

The sealing resin layer 30 is formed of, for example, thermosetting resin such as epoxy resin, and, by resin-sealing the semiconductor chip 1, bonding wires 5, etc., the sealing resin layer 30 has a function of protecting the semiconductor chip 1, the bonding wires 5, etc. from gas, moisture, etc. Moreover, as shown in FIG. 2, the sealing resin layer 30 is formed to be quadrangular as seen in a plan view. That is, the sealing resin layer 30 has four sides as seen in a plan view. From each of the four sides of the quadrangular sealing resin layer 30, a predetermined number of lead terminals 21 (outer lead portions 21*a*) project.

In the first embodiment, the die pad 10 is formed of a 42 alloy or a Kovar alloy as described above. This, compared with where the die pad 10 is formed of a copper alloy or the like, helps make the difference in thermal expansion coefficient between the die pad 10 and the semiconductor chip 1 small. Thus, even though the semiconductor chip 1 is secured on the die pad 10 via the first solder layer 2, it is possible to make the difference in warping between the die pad 10 and the semiconductor chip 1 small. Specifically, the thermal expansion coefficients of a 42 alloy and a Kovar alloy are about 4 to 8 ppm/K and about 5 to 7 ppm/K, respectively, and are both, compared with the thermal expansion coefficient (about 17 ppm/K) of a copper alloy, close to the thermal expansion coefficient (about 3 to 4 ppm/K) of the semiconductor chip 1 (silicon substrate). Thus, it is possible to make the difference in the amount of thermal expansion, at the time of soldering, between the semiconductor chip 1 and the die pad 10 small. It is therefore possible, at the time of securing the semiconductor chip 1 on the die pad 10 via the first solder layer 2, to make the difference in warping, resulting from temperature drop, between the die pad 10 and the semiconductor chip 1 small, and it is thus possible to alleviate stress (warping in the semiconductor chip 1) acting on the semiconductor chip 1. This makes it possible to prevent the semiconductor chip 1 from suffering damage such as in the form of cracks.

Moreover, in the first embodiment, the die pad 10 is formed with a thickness less than that (about 0.15 mm) of the lead terminals 21, specifically about 0.125 mm. In this way, even though the die pad 10 is formed of a 42 alloy or a Kovar alloy, it is possible to easily form the die pad 10 and thus to easily obtain the resin-sealed semiconductor device 100 in which the difference in thermal expansion coefficient between the semiconductor chip 1 and the die pad 10 is small.

Moreover, in the first embodiment, the die pad 10 is formed with a thickness equal to or less than the thickness of the lead terminals 21. This helps make the resin-sealed semiconductor device 100 slim.

Moreover, in the first embodiment, the lead terminals 21 are formed of copper or a copper alloy. This helps make the thermal expansion coefficient (about 17 ppm/K) of the lead terminals 21 substantially equal to the thermal expansion coefficient (e.g., about 17 ppm/K) of the mounting substrate 40 formed of glass epoxy or the like. Thus, at the time of surface-mounting the resin-sealed semiconductor device 100 on the mounting substrate 40, even if the resin-sealed semiconductor device 100, the mounting substrate 40, etc. are subjected to a temperature change cycle, it is possible to alleviate thermal stress acting on a solder junction (third solder layer 4) that electrically connects the lead terminals 21 with the mounting substrate 40. In this way, even though the die pad 10 is formed of a 42 alloy or a Kovar alloy, it is possible to prevent a crack from developing in the solder junction (third solder layer 4). Thus, it is possible to prevent an inconvenience in which, due to a crack developing in the solder junction (third solder layer 4), the electrical connection between the lead terminals 21 and the mounting substrate 40 is cut. As a result, it is possible, while preventing damage to the semiconductor chip 1, to prevent lowering in the mounting reliability of the resin-sealed semiconductor device 100.

Moreover, in the first embodiment, the bottom surface 10b of the die pad 10 is exposed through the bottom surface of the sealing resin layer 30. In addition, the exposed bottom surface 10b of the die pad 10 is in thermal contact with the mounting surface of the mounting substrate 40 via the second solder layer 3. This makes it possible to transfer the heat generated during operation of the semiconductor chip 1, via the die pad 10, to the mounting substrate 40. Thus, it is possible, while preventing damage to the semiconductor chip 1, to enhance the heat dissipation properties.

Moreover, in the first embodiment, the cut-off portions 12 are provided one in each of the four corners formed by the bottom surface lob of the die pad 10 and the side surfaces of the die pad 10. In this way, even if moisture etc. enters through the interface between the die pad 10 and the sealing resin layer 30, it is possible to lengthen the entry path to the semiconductor chip 1. This makes the moisture etc. less likely to reach the semiconductor chip 1. It is therefore possible to prevent an inconvenience in which, due to the moisture etc. that has reached the semiconductor chip 1 thermally expanding, the semiconductor chip 1 is damaged. In addition, it is possible to prevent a lowering in the reliability due to the moisture etc. entering and reaching the semiconductor chip 1.

Moreover, in the first embodiment, the open parts 14 that penetrate from the top surface 10a side to the bottom surface lob side of the die pad 10 are provided in a predetermined region other than the chip securing region 13 of the die pad 10. This makes it possible, even if the moisture etc. that has entered through the interface between the die pad 10 and the sealing resin layer 30 reaches the top surface 10a side of the die pad 10 to which the semiconductor chip 1 is secured, to remove the moisture etc., via the open parts 14, to the bottom surface lob side of the die pad 10. Thus, it is possible to prevent the accumulation of moisture etc. near the semiconductor chip 1. It is therefore possible to prevent an inconvenience more easily in which, due to the moisture etc. that has reached the semiconductor chip 1 thermally expanding, the semiconductor chip 1 is damaged.

Moreover, in the first embodiment, the plurality of open parts 14 are so provided as to surround the semiconductor chip 1 as seen in a plan view. This makes it possible to easily remove the moisture etc. that has reached the top surface 10a side of the die pad 10, via the plurality of open parts 14, to the bottom surface 10b side of the die pad 10. Thus, it is possible to easily prevent the accumulation of moisture etc. near the semiconductor chip 1.

FIGS. 7 to 14 are diagrams illustrating a method of manufacturing the resin-sealed semiconductor device according to the first embodiment of the invention shown in FIG. 1. With reference to FIGS. 1, 3, 4, and 6 to 14, a description will now be given of the method of manufacturing the resin-sealed semiconductor device 100 according to the first embodiment of the invention.

Figure 7:
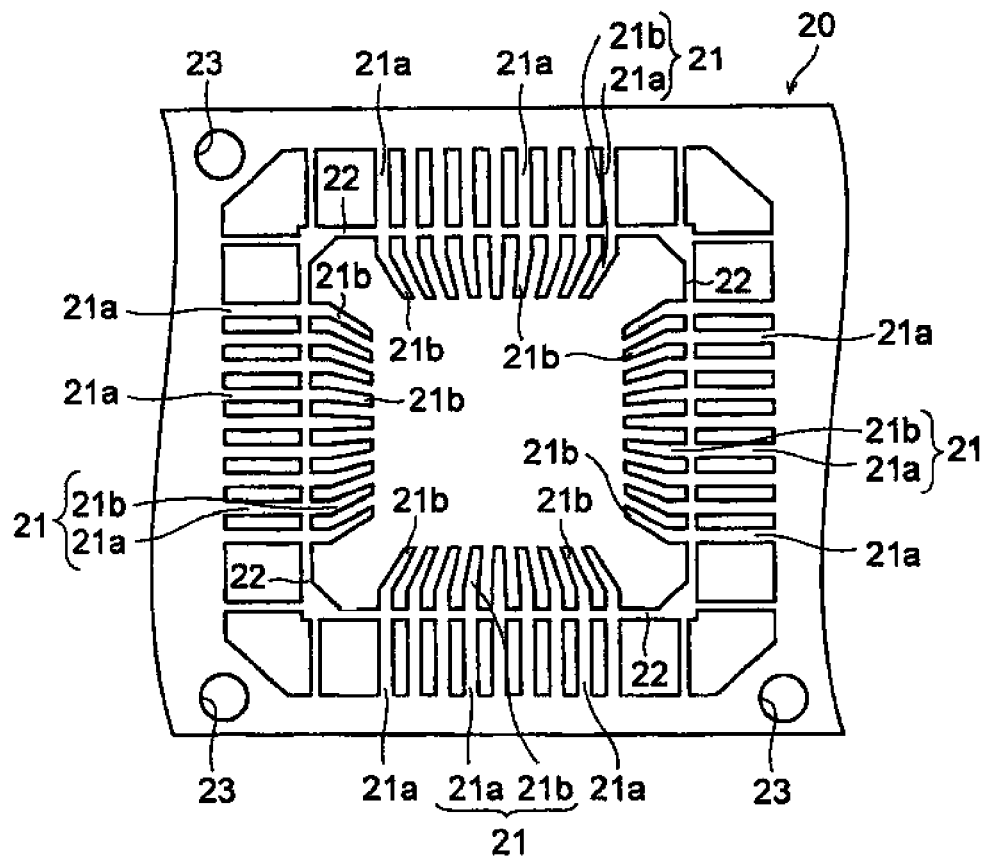
FIG. 7 A plan view illustrating a method of manufacturing the resin-sealed semiconductor device according to the first embodiment of the invention shown in FIG. 1.
Figure 8:
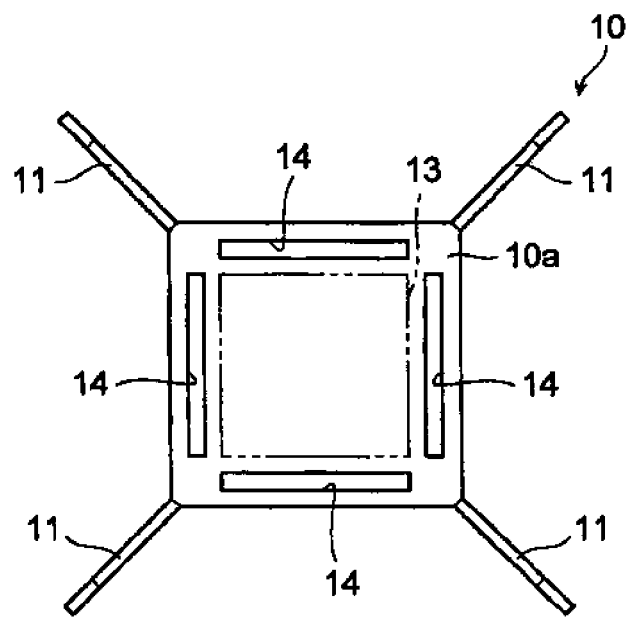
FIG. 8 A plan view illustrating the method of manufacturing the resin-sealed semiconductor device according to the first embodiment of the invention shown in FIG. 1.

First, as shown in FIG. 7, by punch-pressing or etching a thin plate that is formed of a material based on copper (copper or a copper alloy) such as phosphor bronze or oxygen-free copper and that has a thickness of about 0.15 mm, a lead frame 20 is formed as a single piece. Here, the lead frame 20 is formed to include a plurality of lead terminals 21, dam members 22, positioning holes 23, etc. Note that the lead frame 20 is formed so as not to include a die pad 10. Next, as shown in FIG. 8, as a separate piece from the lead frame 20, a die pad 10 is formed.

Here, in the first embodiment, the die pad 10 is formed by punch-pressing or etching a thin plate that is formed of a 42 alloy or a Kovar alloy and that has a thickness of about 0.125 mm. Here, the die pad 10 is formed to be quadrangular as seen in a plan view. In addition, as shown in FIG. 6, in each of four corner parts formed by the bottom surface 10b of the die pad 10 and the side surfaces of the die pad 10, a cut-off portion 12 is formed. Moreover, as shown in FIG. 8, at each of the four corner parts of the die pad 10, a suspension lead 11 that extends radially, as seen in a plan view, is formed integrally.

Moreover, in the first embodiment, the die pad 10 is formed to have a plan area larger than a semiconductor chip 1. In addition, so as to surround a chip securing region 13 to which the semiconductor chip 1 is secured, a plurality of open parts 14 (see FIGS. 4 and 6) are formed that penetrate from the top surface 10a side to the bottom surface 10b side of the die pad 10.

Figure 9:
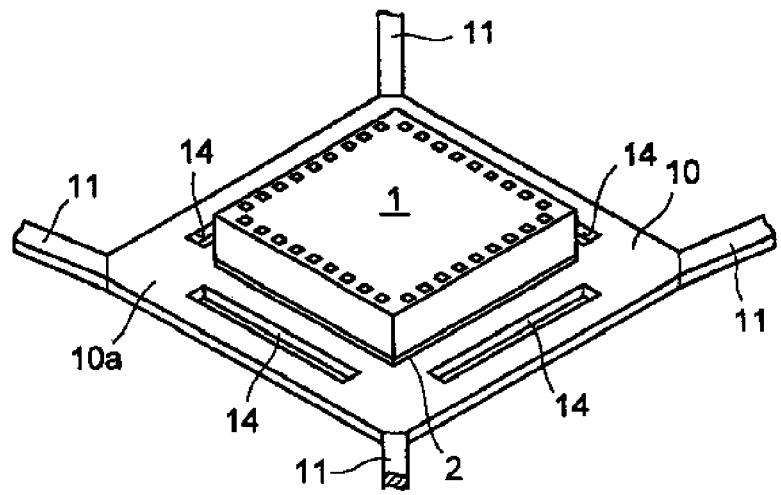
FIG. 9 A perspective view illustrating the method of manufacturing the resin-sealed semiconductor device according to the first embodiment of the invention shown in FIG. 1.

Next, as shown in FIG. 9, to the chip securing region 13 (see FIG. 8) of the die pad 10, via a first solder layer 2, the semiconductor chip 1 is secured. Specifically, to the chip securing region 13 of the die pad 10, solder paste (unillustrated) formed of high-melting solder is applied, and then on the solder paste, the semiconductor chip 1 is placed. Next, the die pad 10 having the semiconductor chip 1 placed thereon is put in a reflow furnace to melt the solder paste. The reflow temperature is, for example, about 350° C. Then, by cooling the melted solder paste, a first solder layer 2 is formed. In this way, the semiconductor chip 1 is secured, via the first solder layer 2, on the top surface 10a of the die pad 10.

Figure 10:
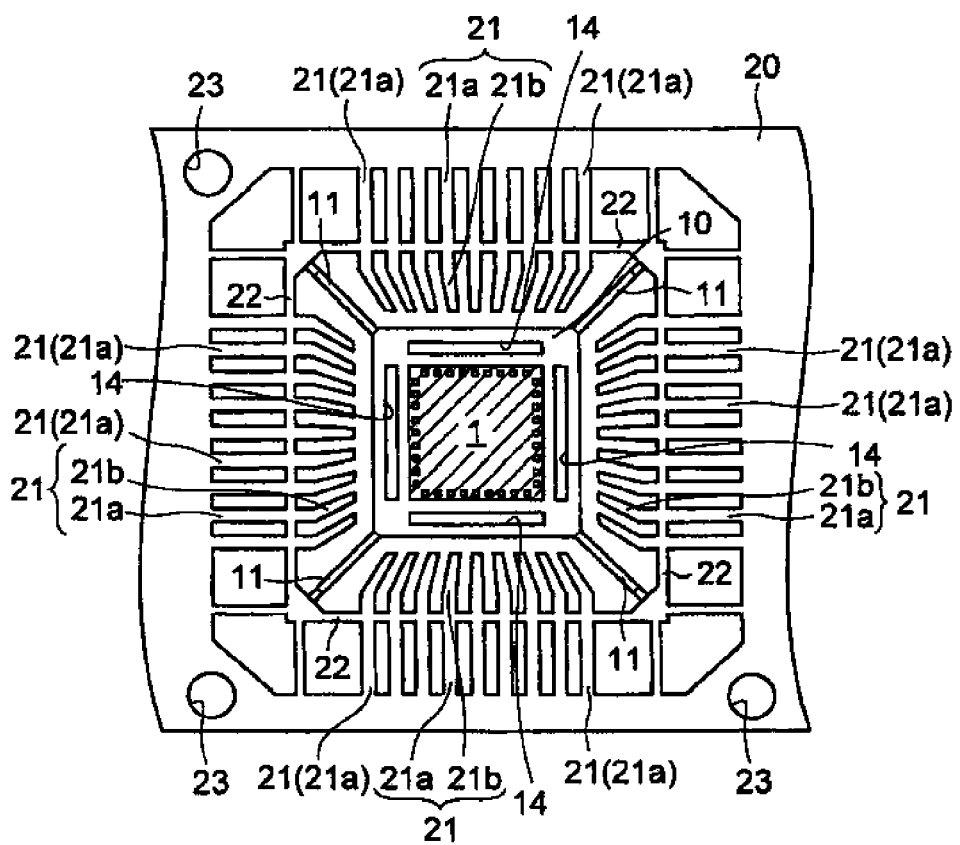
FIG. 10 A plan view illustrating the method of manufacturing the resin-sealed semiconductor device according to the first embodiment of the invention shown in FIG. 1.
Figure 11:
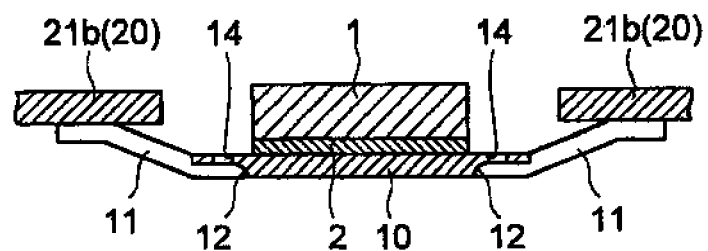
FIG. 11 A sectional view illustrating the method of manufacturing the resin-sealed semiconductor device according to the first embodiment of the invention shown in FIG. 1.
Figure 12:
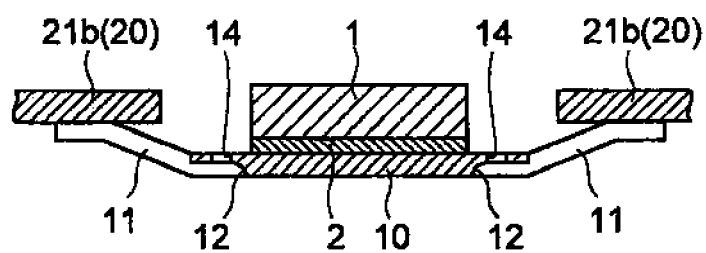
FIG. 12 A sectional view illustrating the method of manufacturing the resin-sealed semiconductor device according to the first embodiment of the invention shown in FIG. 1.

Then, as shown in FIGS. 10 and 11, the four suspension leads 11 are bent. In addition, tip parts of the suspension leads 11 are connected to predetermined positions on the lead frame 20, respectively. In this way, as shown in FIG. 11, the die pad 10 is, in a state disposed at a level below inner lead portions 21b, connected to the lead frame 20. Here, as shown in FIG. 12, the joining (connecting) of the lead frame 20 with the suspension leads 11 is performed by ultrasonic joining.

Figure 13:
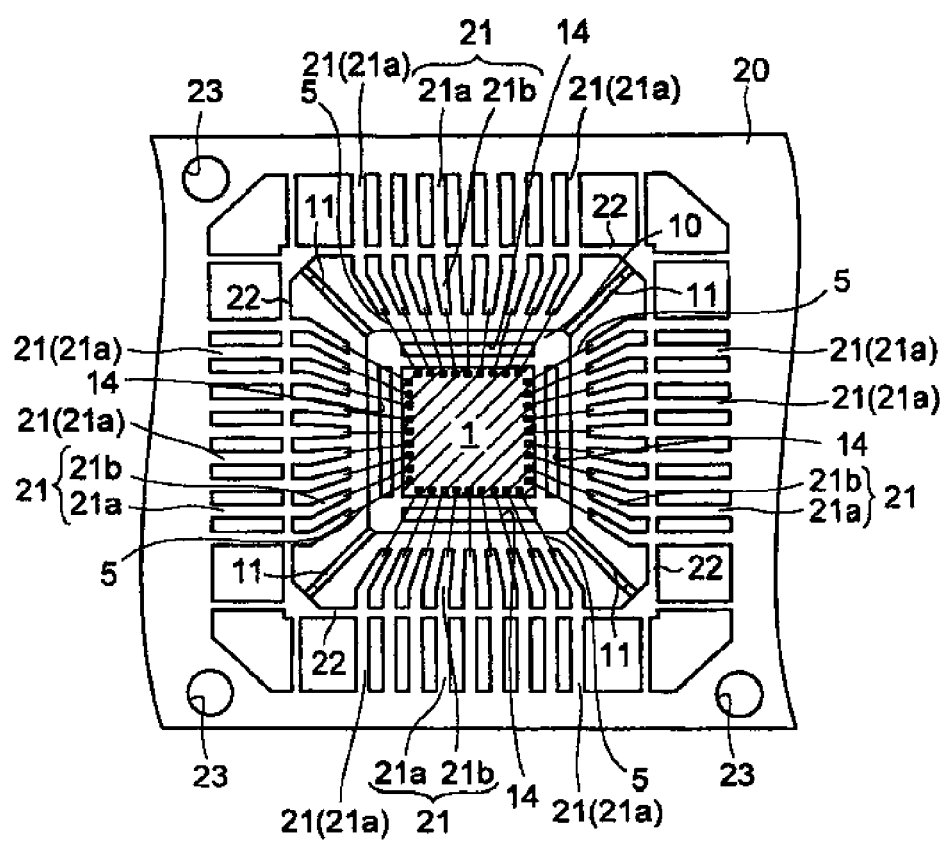
FIG. 13 A plan view illustrating the method of manufacturing the resin-sealed semiconductor device according to the first embodiment of the invention shown in FIG. 1.
Figure 14:
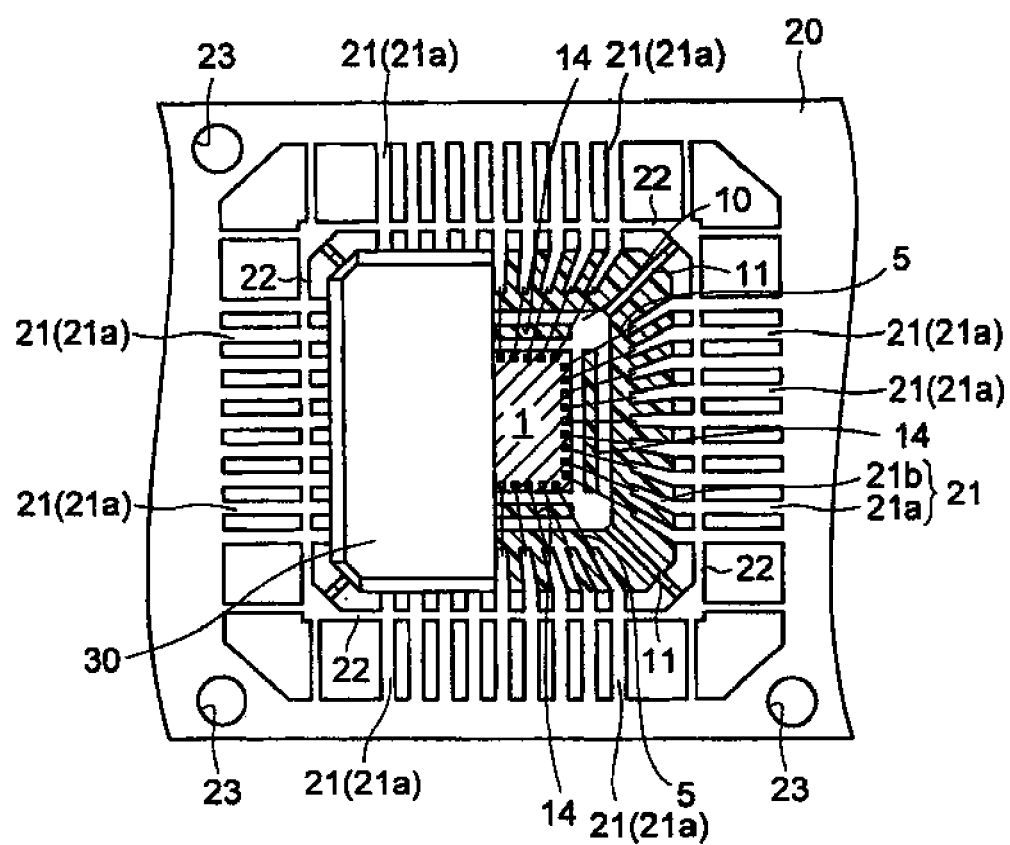
FIG. 14 A plan view illustrating the method of manufacturing the resin-sealed semiconductor device according to the first embodiment of the invention shown in FIG. 1.

Next, as shown in FIG. 13, electrode pads of the semiconductor chip 1 and the inner lead portions 21b are electrically connected together via bonding wires 5. Then, as shown in FIG. 14, on a transfer molding machine or the like, the inner lead portions 21b of the lead terminals 21, the semiconductor chip 1, the bonding wires 5, and the die pad 10 are resin-sealed with a sealing resin layer 30. Note that, as shown in FIG. 3, the bottom surface 10b of the die pad 10 is so formed as to be exposed through the bottom surface of the sealing resin layer 30.

Next, the parts of the suspension leads 11 projecting from the sealing resin layer 30, the lead terminals 21 (outer lead portions 21a), and the dam members 22 are cut, respectively. Lastly, the outer lead portions 21a are bent in a gull-wing shape outside the sealing resin layer 30. In this way, the resin-sealed semiconductor device 100 according to the first embodiment of the invention shown in FIG. 1 is manufactured.

In the method of manufacturing the resin-sealed semiconductor device 100 according to the first embodiment, as described above, by ultrasonic joining, the suspension leads 11 of the die pad 10 are joined to predetermined positions on the lead frame 20, respectively. In this way, even though the die pad 10 is formed as a separate piece from the lead frame 20, it is possible to easily join the die pad 10 to a predetermined position on the lead frame 20. Thus, it is possible to easily manufacture the resin-sealed semiconductor device 100 that can prevent damage to the semiconductor chip 1.

Moreover, in the first embodiment, the die pad 10 is joined to the lead frame 20 by ultrasonic joining. This makes it possible to prevent various inconveniences that occur when the die pad 10 is joined to the lead frame 20 by swage joining or spot welding, other than ultrasonic joining. Specifically, when the die pad 10 is joined to the lead frame 20 by swage joining, there are required pins, dies, etc. to perform swage joining. This inconveniently requires an increased number of components and extra manufacturing equipment. On the other hand, when the die pad 10 is joined to the lead frame 20 by spot welding, due to the heat generated during welding, the semiconductor chip 1 secured on the die pad 10 inconveniently suffers thermal damage. Thus, by joining the die pad 10 to the lead frame 20 by ultrasonic joining, it is possible to prevent an increase in the number of components and the need for extra manufacturing equipment, and in addition to prevent an inconvenience in which the semiconductor chip 1 suffers thermal damage.

A description will now be given of an experiment that was performed to check the effects of the above-described first embodiment. In this experiment, to check the influence of the material of the die pad on the crack incidence in the semiconductor chip, the amount of warping in the semiconductor chip and the crack incidence in the semiconductor chip when the material of the die pad was changed were measured. Specifically, by use of a method similar to the above-described method of manufacturing, a semiconductor chip was secured on a die pad via a solder layer (first solder layer) to make samples of example 1 and a comparative example. Note that samples in which a semiconductor chip was secured on a die pad formed of a 42 alloy were taken as example 1; samples in which a semiconductor chip was secured on a die pad formed of a material based on copper (copper or a copper alloy) were taken as the comparative example. The chip size of the semiconductor chip secured on the die pad was, for both example 1 and the comparative example, either a 7 mm square semiconductor chip with a side length of 7 mm or a 5 mm square semiconductor chip with a side length of 5 mm. For each size, ten samples of example 1 and the comparative example each were prepared. The thickness of the die pad was, for both example 1 and the comparative example, about 0.125 mm.

Figure 15:
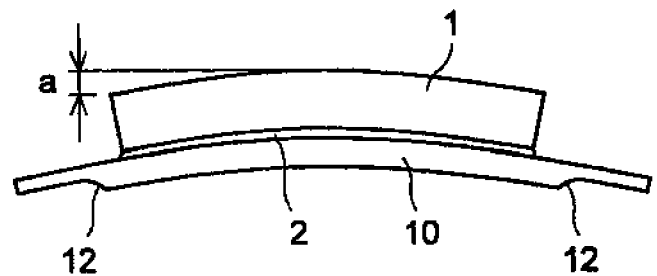
FIG. 15 A diagram schematically showing a method of measuring the amount of warping in a semiconductor chip secured on a die pad.

FIG. 15 is a diagram schematically showing a method of measuring the amount of warping in the semiconductor chip secured on the die pad. With reference to FIG. 15, the warping amount a in the semiconductor chip was calculated as the difference between the height position of the center of the semiconductor chip 1 and the height position of an end part of the semiconductor chip 1. The warping amount a in the semiconductor chip 1 was measured with an infrared non-contact displacement meter (LT-8010) manufactured by KEYENCE, Japan. Then, the average value of the results of measuring ten samples each was taken as the average warping amount of the semiconductor chip 1. The crack incidence in the semiconductor chip 1 was calculated by first checking whether there was a crack by visual observation, and then dividing the number of semiconductor chips 1 having a crack by the total semiconductor chip number (ten). The results are shown in Table 1.

TABLE 1

| Semiconductor chip size | Example 1 42 alloy | | Comparative example Material based on copper | |
|---|---|---|---|---|
| | Average warping amount (μm) | Crack incidence (%) | Average warping amount (μm) | Crack incidence (%) |
| 7 mm square | 7.6 | 0 | 70 | 100 |
| 5 mm square | 3.6 | 0 | 25 | 100 |

As shown in Table 1, as a result of comparing example 1 and the comparative example, it was found that the average warping amount of the semiconductor chip was significantly small in example 1 than in the comparative example. Specifically, for the samples on which a 7 mm square semiconductor chip was secured, in the comparative example where a die pad formed of copper or a copper alloy was used, the average warping amount of the semiconductor chip was 70 μm, whereas in example 1 where a die pad formed of a 42 alloy was used, the average warping amount of the semiconductor chip was 7.6 μm, which was about 1/9 of the value observed in the comparative example. For the samples on which a 5 mm square semiconductor chip was secured, in the comparative example, the average warping amount of the semiconductor chip was 25 μm, whereas in example 1, the average warping amount of the semiconductor chip was 3.6 μm, which was about 1/7 of the value observed in the comparative example. The crack incidence in the semiconductor chip was, in the comparative example, 100% in both cases, whereas in example 1, it was 0% in both cases.

As described above, it was found that, by forming the die pad from a 42 alloy, whose thermal expansion coefficient differs little from that of the semiconductor chip (silicon substrate), even though the thickness of the die pad was about 0.125 mm, the amount of warping in the semiconductor chip secured on the die pad could be alleviated. Moreover, it was found that, since the crack incidence was greatly influenced by the amount of warping in the semiconductor chip, by alleviating the amount of warping in the semiconductor chip, the crack incidence could be alleviated. Moreover, it was found that, by forming the die pad from a 42 alloy, even if a semiconductor chip having a larger chip size was secured thereon, the development of a crack could be prevented. Note that in example 1, a die pad formed of a 42 alloy was used; however, even with a die pad formed of a Kovar alloy (thermal expansion coefficient: about 5 to 7 ppm/K), whose thermal expansion coefficient differs little from that (about 4 to 8 ppm/K) of a 42 alloy, it is expected that a result similar to that described above will be obtained.

Second Embodiment

Figure 16:
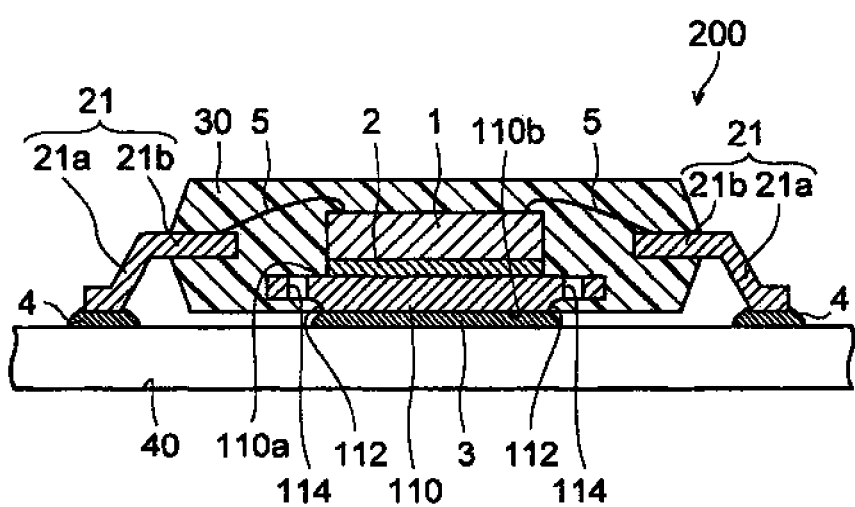
FIG. 16 A sectional view of a resin-sealed semiconductor device according to a second embodiment of the invention.
Figure 17:
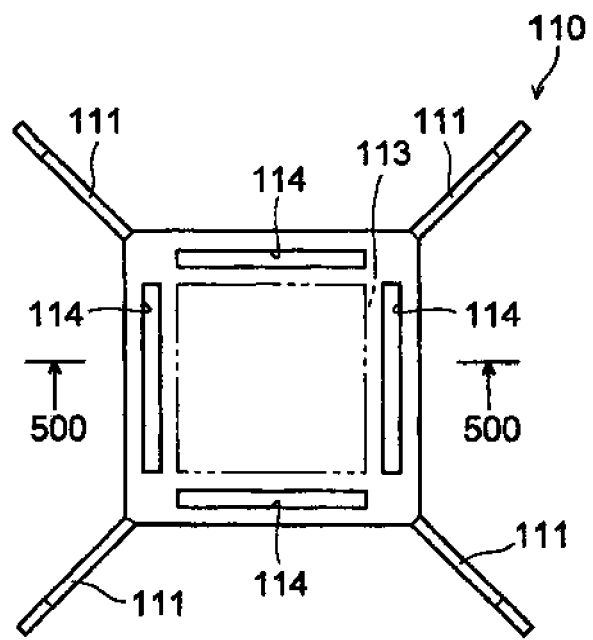
FIG. 17 A plan view of a die pad of the resin-sealed semiconductor device according to the second embodiment of the invention shown in FIG. 16.
Figure 18:
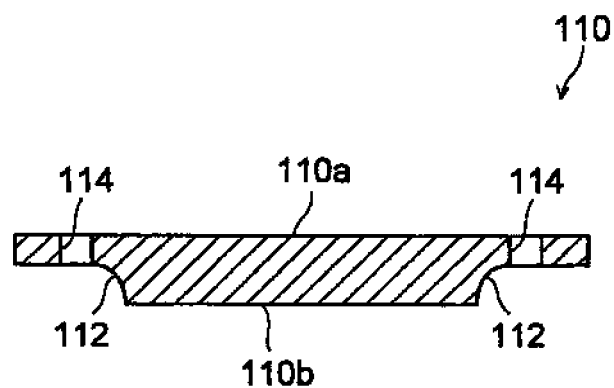
FIG. 18 A sectional view taken along line 500-500 in FIG. 17.

FIG. 16 is a sectional view of a resin-sealed semiconductor device according to a second embodiment of the present invention. FIG. 17 is a plan view of a die pad of the resin-sealed semiconductor device according to the second embodiment of the invention shown in FIG. 16. FIG. 18 is a sectional view taken along line 500-500 in FIG. 17. With reference to FIGS. 16 to 18, a description will now be given of the structure of the resin-sealed semiconductor device 200 according to the second embodiment. Except for the die pad 110, the structure of the resin-sealed semiconductor device 200 is similar to that in the above-described first embodiment, and no description of it will be repeated.

In the resin-sealed semiconductor device 200 according to the second embodiment, as distinct from the above-described first embodiment, the die pad 110 is formed of copper or a copper alloy. Moreover, as shown in FIG. 16, the die pad 110 is formed with a thickness larger than that (about 0.15 mm) of the lead terminals 21. Specifically, the die pad 110 is formed with a thickness of about 0.25 mm, and preferably about 0.5 mm. Note that in other respects, the structure of the die pad 110 is similar to that of the die pad 10 (see FIGS. 4 to 6) according to the above-described first embodiment. That is, as shown in FIGS. 17 and 18, the die pad 110 includes four suspension leads 111 connected integrally thereto. Moreover, in corner parts formed by a bottom surface (the other main surface) 110b of the die pad 110 and side surfaces of the die pad 110, cut-off portions 112 are provided as shown in FIG. 18. Moreover, on a top surface (one main surface) 110a of the die pad 110, a chip securing region 113 to which a semiconductor chip 1 is secured is provided. To surround the chip securing region 113, open parts 14 that penetrate from the top surface 110a side to the bottom surface 110b side of the die pad 110 are provided.

In the second embodiment, as described above, the die pad 110 is formed with a thickness larger than the lead terminals 21, specifically about 0.25 mm, and preferably about 0.5 mm. This makes it possible to provide the die pad 110 with adequate strength. Thus, even though the die pad 110 is formed of copper or a copper alloy, it is possible, at the time of securing the semiconductor chip 1, via the first solder layer 2, on the die pad 110, to prevent an increase in the warping in the die pad 110. Thus, it is possible to alleviate stress (warping in the semiconductor chip 1) acting on the semiconductor chip 1 and thus to prevent the semiconductor chip 1 from suffering damage such as in the form of cracks.

Moreover, in the second embodiment, the die pad 110 and the lead terminals 21 are given different thicknesses. In this way, even though the thickness of the die pad 110 is made large, it is possible to prevent an increase in the thickness of the lead terminals 21. Thus, it is possible to easily form, bend, etc. the lead terminals 21. Thus, it is possible, while preventing damage to the semiconductor chip 1, to enhance the manufacturing efficiency of the resin-sealed semiconductor device.

In other respects, the effects of the second embodiment are similar to those of the first embodiment previously described.

A description will now be given of a method of manufacturing the resin-sealed semiconductor device 200 according to the second embodiment of the invention with reference to FIGS. 7, and 16 to 18.

First, as shown in FIG. 7, with a method similar to that of the above-described first embodiment, a lead frame 20, as in the above-described first embodiment, is formed. Next, as shown in FIGS. 17 and 18, by punch-pressing or etching a thin plate that is formed of copper or a copper alloy and that has a thickness of about 0.25 mm, and preferably about 0.5 mm, the die pad 110 is formed. Here, except for the material and the thickness, the structure of the die pad 110 is similar to that in the first embodiment previously described. Thereafter, with a manufacturing method similar to that in the first embodiment described previously, the outer lead portions 21a are bent. In this way, the resin-sealed semiconductor device 200 according to the second embodiment of the invention shown in FIG. 16 is manufactured.

A description will now be given of an experiment that was performed to check the effects of the above-described second embodiment. In this experiment, to check the influence of the thickness of the die pad on the crack incidence in the semiconductor chip, the amount of warping in the semiconductor chip and the crack incidence in the semiconductor chip when the thickness of the die pad was changed were measured. Specifically, with a manufacturing method similar to that described previously, a semiconductor chip was secured on a die pad via a solder layer (first solder layer) to make samples of example 2 and example 3. The die pad, in both examples, was formed of a material based on copper (copper or a copper alloy), and the thickness thereof alone was changed. That is, samples in which a semiconductor chip was secured on a die pad that has a thickness of about 0.25 mm and is formed of a material based on copper were taken as example 2; samples in which a semiconductor chip was secured on a die pad that has a thickness of about 0.5 mm and is formed of a material based on copper were taken as example 3. The chip size of the semiconductor chip secured on the die pad was, as in the above-described first embodiment (example 1 and the comparative example), for both example 2 and example 3, either a 7 mm square semiconductor chip with a side length of 7 mm or a 5 mm square semiconductor chip with a side length of 5 mm. For each size, ten samples of example 2 and example 3 each were prepared. The amount of warping in the semiconductor chip and the crack incidence in the semiconductor chip, in both cases, were measured with a method similar to that in the above-described first embodiment. The results are shown in Table 2 along with the results with the comparative example of the above-described first embodiment.

TABLE 2

| Semiconductor chip size | Comparative example Thickness of die pad 0.125 mm | | Example 2 Thickness of die pad 0.25 mm | | Example 3 Thickness of die pad 0.5 mm | |
| --- | --- | --- | --- | --- | --- | --- |
| | Average warping amount (μm) | Crack incidence (%) | Average warping amount (μm) | Crack incidence (%) | Average warping amount (μm) | Crack incidence (%) |
| 7 mm square | 70 | 100 | 65 | 100 | 34.2 | 0 |
| 5 mm square | 25 | 100 | 22 | 60 | 13 | 0 |

As shown in Table 2, as a result of comparing example 2 and the comparative example, it was found that the average warping amount of the semiconductor chip was small in example 2 than in the comparative example. Specifically, for the samples on which a 7 mm square semiconductor chip was secured, in the comparative example where a die pad having a thickness of about 0.125 mm was used, the average warping amount of the semiconductor chip was 70 μm, whereas in example 2 where a die pad having a thickness of about 0.25 mm was used, the average warping amount of the semiconductor chip was 65 μm. On the other hand, for the samples on which a 5 mm square semiconductor chip was secured, in the comparative example, the average warping amount of the semiconductor chip was 25 μm, whereas in example 2, the average warping amount of the semiconductor chip was 22 μm.

The crack incidence in the semiconductor chip, for the samples on which a 7 mm square semiconductor chip was secured, in both example 2 and the comparative example, was 100%, and superiority of example 2 over the comparative example was not recognized. However, for the samples on which a 5 mm square semiconductor chip was secured, in the comparative example, the crack incidence in the semiconductor chip was 100%, whereas in example 2, the crack incidence in the semiconductor chip was 60%, and superiority of example 2 over the comparative example was recognized.

As shown in Table 2, as a result of comparing example 3 and the comparative example, it was found that the average warping amount of the semiconductor chip was small in example 3 than in the comparative example. Specifically, for the samples on which a 7 mm square semiconductor chip was secured, in example 3 where a die pad having a thickness of about 0.5 mm was used, the average warping amount of the semiconductor chip was 34.2 μm. On the other hand, for the samples on which a 5 mm square semiconductor chip was secured, the average warping amount of the semiconductor chip was 13 μm. These values, in both cases, were as small as about ½ of that of the comparative example. The crack incidence in the semiconductor chip, in example 3, was 0% for both cases.

As described above, it was found that, by making the thickness of the die pad large, even though the die pad is formed of a material based on copper, it was possible to reduce the amount of warping in the semiconductor chip secured on the die pad. Moreover, it was found that, by reducing the amount of warping in the semiconductor chip, it was possible to alleviate the crack incidence in the semiconductor chip. Note that in example 2, it was found that, within the range in which the chip size of the semiconductor was relatively small, the effect of alleviating the crack incidence in the semiconductor chip was great. In addition, in example 3, it was found that, even when the chip size of the semiconductor chip was large, the effect of alleviating the crack incidence in the semiconductor chip was great.

It is to be understood that the embodiments described above are in all aspects simply exemplary and not limitative. The scope of the present invention is set out in the appended claims and not in the description of the embodiments hereinabove, and includes any variations and modifications within the sense and scope equivalent to those of the claims.

For example, although the above-described first and second embodiments deal with an example in which the present invention is applied to a resin-sealed semiconductor device of a QFP type, this is not meant to limit the invention; so long as a resin-sealed semiconductor device including a die pad is involved, it is also possible to apply the invention to a resin-sealed semiconductor device of a type other than QFP. Examples of resin-sealed semiconductor devices of types other than QFP include resin-sealed semiconductor devices of, for example, a QFN (quad flat non-leaded package) type, a QFJ (quad flat J-lead package) type, an SOP (small outline package) type, an SOJ (small outline J-lead package) type, etc.

Moreover, although the above-described first and second embodiments deal with an example in which the resin-sealed semiconductor device is formed such that the bottom surface of the die pad is exposed through the bottom surface of the sealing resin layer, this is not meant to limit the invention; it is also possible to form the resin-sealed semiconductor device such that the bottom surface of the die pad is covered with the sealing resin layer.

Moreover, although the above-described first and second embodiments deal with an example in which the cut-off portions are provided one in each of the four corner parts formed by the bottom surface of the die pad and the side surfaces of the die pad, this is not meant to limit the invention; it is also possible to provide the cut-off portions in part of the corner parts formed by the bottom surface of the die pad and the side surfaces of the die pad. Moreover, it is also possible to provide no cut-off portion in the die pad.

Moreover, although the above-described first and second embodiments deal with an example in which a plurality of open parts are provided in the die pad to penetrate it from the top surface side thereof to the bottom surface side thereof, this is not meant to limit the invention; it is also possible to provide one open part alone in the die pad to penetrate it from the top surface side thereof to the bottom surface side thereof. Moreover, it is also possible to provide no open part.

Moreover, although the above-described first and second embodiments deal with an example in which, in the manufacturing process of the resin-sealed semiconductor device, the suspension leads of the die pad and the lead frame are joined (connected) together by ultrasonic joining, this is not meant to limit the invention; a joining method other than ultrasonic joining may be used to connect together the suspension leads of the die pad and the lead frame. For example, swage joining or spot welding may be used to connect together the suspension leads of the die pad and the lead frame. Moreover, when the invention is applied to a resin-sealed semiconductor device of a QFN type, the resin-sealed semiconductor device may be manufactured without connecting together the die pad and the lead frame.

Moreover, although the above-described first and second embodiments deal with an example in which first the semiconductor chip is secured on the die pad, and then the die pad having the semiconductor chip secured thereon is connected to the lead frame, this is not meant to limit the invention; it is also possible to first connect the die pad to the lead frame and then secure the semiconductor chip on the die pad connected to the lead frame.

Moreover, although the above-described first embodiment deals with an example in which the die pad is formed with a thickness smaller than the lead terminals, this is not meant to limit the invention; it is also possible to form the die pad with a thickness equal to that of the lead terminals.

What is claimed is:
1. A resin-sealed semiconductor device comprising:
a semiconductor chip including a silicon substrate;
a die pad on which the semiconductor chip is secured via a solder layer;
a sealing resin layer sealing the semiconductor chip; and
a plurality of lead terminals connected electrically with the semiconductor chip, one end portion of the plurality of lead terminals being covered by the sealing resin layer,
wherein the die pad and the lead terminals are formed of copper or a copper alloy, wherein the die pad has a curved side surface so as to have a gradually varying thickness, wherein the die pad has a plan area larger than a plan area of the semiconductor chip, wherein, in the die pad, only in a predetermined region other than a region in which the semiconductor chip is arranged, an open part that penetrates from one main surface side to the other main surface side of the die pad is provided, wherein outer edges of the open part along a longer-side direction thereof are formed of two sides extending continuously in a direction along an edge line of the semiconductor chip, wherein the curved side surface has a center of curvature in a direction of a bottom surface of the die pad, and wherein the open part is in a vicinity of the semiconductor chip so as to prevent accumulation of moisture near the semiconductor chip.

2. The resin-sealed semiconductor device according to claim 1, wherein the curved side surface is connected to the open part.

3. The resin-sealed semiconductor device according to claim 1, wherein the semiconductor chip is secured on one main surface of the die pad, and wherein the die pad is disposed such that the other main surface of the die pad opposite from the one main surface thereof is exposed through the sealing resin layer.

4. The resin-sealed semiconductor device according to claim 1, wherein, in the die pad, in a corner part formed by the other main surface and a side surface, a cut-off portion is provided.

5. The resin-sealed semiconductor device according to claim 1,
wherein the semiconductor chip is secured on one main surface of the die pad, and wherein another main surface of the die pad opposite from the one main surface thereof is flush with another end portion of the lead terminals not covered by the sealing resin layer.

6. The resin-sealed semiconductor device according to claim 1, wherein the die pad and the lead terminals have different thicknesses.

7. The resin-sealed semiconductor device according to claim 1, wherein the curved side surface provided at a side surface of the die pad is formed by etching.

8. A resin-sealed semiconductor device comprising:
a semiconductor chip including a silicon substrate;
a die pad on which the semiconductor chip is secured via a solder layer;
a sealing resin layer sealing the semiconductor chip; and
a plurality of lead terminals connected electrically with the semiconductor chip, one end portion of the plurality of lead terminals being covered by the sealing resin layer,
wherein the die pad and the lead terminals are formed of copper or a copper alloy,
wherein the die pad has varying thickness so as to be thinner in a peripheral part than in a central part,
wherein in the peripheral part of the die pad where the die pad is thinner, an opening is formed which penetrates the die pad from one main surface to another main surface thereof,
wherein the die pad has a planar area larger than a planar area of the semiconductor chip, and wherein the opening is formed only in a predetermined region of the die pad other than a region thereof where the semiconductor chip is arranged, and outer edges of the opening along a longer-side direction thereof are formed of two sides extending continuously in a direction along an edge line of the semiconductor chip, wherein the opening is in a vicinity of the semiconductor chip so as to prevent the accumulation of moisture near the semiconductor chip.

9. The resin-sealed semiconductor device according to claim 8,
wherein the die pad has gradually varying thickness by having a side surface formed into a curved surface, and
wherein the curved surface has a center of curvature in a direction of a bottom surface of the die pad.

10. The resin-sealed semiconductor device according to claim 8,
wherein the semiconductor chip is secured on one main surface of the die pad, and
wherein the die pad is arranged such that another main surface of the die pad opposite from the one main surface thereof is exposed out of the sealing resin layer.

11. The resin-sealed semiconductor device according to claim 8, wherein the die pad has a cut-off portion formed in a corner portion thereof formed by the other main surface and a side surface thereof.

12. The resin-sealed semiconductor device according to claim 8,
wherein the semiconductor chip is secured on one main surface of the die pad, and
wherein another main surface of the die pad opposite from the one main surface thereof is flush with another end portion of the lead terminals not covered by the sealing resin layer.

13. A resin-sealed semiconductor device comprising:
a semiconductor chip including a silicon substrate;
a die pad on which the semiconductor chip is secured via a solder layer;
a sealing resin layer sealing the semiconductor chip; and
a plurality of lead terminals connected electrically with the semiconductor chip, one end portion of the plurality of lead terminals being covered by the sealing resin layer,
wherein the die pad and the lead terminals are formed of copper or a copper alloy,
wherein the die pad has a round side surface so as to have a gradually varying thickness,
wherein the die pad has a plan area larger than a plan area of the semiconductor chip,
wherein, in the die pad, only in a predetermined region other than a region in which the semiconductor chip is arranged, an aperture that penetrates from one main surface side to the other main surface side of the die pad is provided, and
outer edges of the aperture along a longer-side direction thereof are formed of two sides extending continuously in a direction along an edge line of the semiconductor chip,
wherein the round side surface has a center of curvature in a direction of a bottom surface of the die pad, and
wherein the aperture is in a vicinity of the semiconductor chip so as to prevent the accumulation of moisture near the semiconductor chip.

14. A resin-sealed semiconductor device comprising:
a semiconductor chip including a silicon substrate;
a die pad on which the semiconductor chip is secured via a solder layer;
a sealing resin layer sealing the semiconductor chip; and a plurality of lead terminals connected electrically with the semiconductor chip, one end portion of the plurality of lead terminals being covered by the sealing resin layer, wherein the die pad and the lead terminals are formed of copper or a copper alloy, wherein the die pad has a curved side surface so as to have a gradually varying thickness, wherein the die pad has a plan area larger than a plan area of the semiconductor chip, wherein, in the die pad, only in a predetermined region other than a region in which the semiconductor chip is arranged, an open part that penetrates from one main surface side to the other main surface side of the die pad is provided, wherein the predetermined region is a portion of the die pad with a smaller thickness than elsewhere, and outer edges of the open part along a longer-side direction thereof are formed of two sides extending continuously in a direction along an edge line of the semiconductor chip, wherein the curved side surface has a center of curvature in a direction of a bottom surface of the die pad, and wherein the open part is in a vicinity of the semiconductor chip so as to prevent the accumulation of moisture near the semiconductor chip.

\* \* \* \* \*